United States Patent

Panish et al.

[11] 3,958,263
[45] May 18, 1976

[54] STRESS REDUCTION IN AlGaAs-AlGaAsP MULTILAYER STRUCTURES

[75] Inventors: Morton B. Panish, Springfield; George Arthur Rozgonyi, Chatham, both of N.J.

[73] Assignee: Bell Telephone Laboratories, Incorporated, Murray Hill, N.J.

[22] Filed: Apr. 25, 1974

[21] Appl. No.: 463,871

Related U.S. Application Data

[63] Continuation-in-part of Ser. No. 414,664, Nov. 12, 1973.

[52] U.S. Cl. .................................. 357/18; 357/16; 357/61
[51] Int. Cl.² ............... H01S 33/19; H01L 29/161; H01L 29/205
[58] Field of Search ............... 357/18, 17, 16, 61; 331/94.5 H

[56] References Cited
UNITED STATES PATENTS

| | | | |
|---|---|---|---|
| 3,812,516 | 5/1974 | Hayachi | 317/235 R |
| 3,838,359 | 9/1974 | Hokki | 331/94.5 H |

OTHER PUBLICATIONS

Shih et al., *I.B.M. Tech. Discl. Bull.*, Vol. 11, No. 12, May 1969, p. 1634.
Burnham et al., *Appl. Physics Letters*, Nov. 15, 1970, Vol. 17, No. 10, pp. 455–456.

*Primary Examiner*—Martin H. Edlow
*Attorney, Agent, or Firm*—M. J. Urbano

[57] ABSTRACT

The average stress between contiguous layers of $Al_xGa_{1-x}As$ and $Al_yGa_{1-y}As$ ($y > x$) is reduced by the addition of phosphorus during the growth of the latter layer to produce the quaternary $Al_yGa_{1-y}As_{1-z}P_z$ instead of the ternary $Al_yGa_{1-y}As$. In order to reduce the average stress to less than about $2 \times 10^8$ dynes/cm² the amount of phosphorus added should satisfy the condition:

$$0.03 \leq \frac{z}{y-x} \leq 0.05.$$

Also described is a double heterostructure junction laser comprising a GaAs or AlGaAs active layer sandwiched between layers of AlGaAsP.

10 Claims, 4 Drawing Figures

STRESS REDUCTION IN AlGaAs-AlGaAsP MULTILAYER STRUCTURES

CROSS REFERENCE TO RELATED APPLICATIONS

This application is a continuation-in-part of application Ser. No. 414,664 (Panish-Rozgonyi Case 10-4) filed on Nov. 12, 1973 and was filed concurrently with application Ser. No. 463,870 (Petroff-Rozgonyi Case 2-7) entitled "Reduction of Dislocations in Multilayer Structures of Zinc-Blende Materials." The latter application is a continuation-in-part of application Ser. No. 414,674 (Petroff-Rozgonyi Case 1-5) also filed on Nov. 12, 1973.

BACKGROUND OF THE INVENTION

The invention relates to the reduction of stress between contiguous layers of different semiconductor materials and, more particularly, to double heterostructure junction lasers with reduced current density thresholds for lasing.

In the summer of 1970 I. Hayashi and M. B. Panish reported successful c.w. operation at room temperature of a semiconductor p-n junction laser now known as the double heterostructure (DH) laser (*Applied Physics Letters*, Vol. 17, No. 3, pages 109-111, Aug. 1, 1970). This achievement was the result of intensive efforts both in physics, which led to the design of the DH laser, and in chemistry, which led to improved liquid phase epitaxy (LPE) techniques for realizing the DH laser.

Briefly, the DH laser comprises a narrow bandgap active region, which may be either n-type, p-type or contain a p-n junction in which case it has both conductivity types. The active region is sandwiched between relatively wider bandgap, opposite-conductivity-type layers which form two heterojunctions, one at each interface with the active region. These heterojunctions, as is now wellknown, serve to confine injected carriers as well as stimulated radiation to the active region. Consequently, it was early recognized by Hayashi and Panish that the heterojunctions should have as few defects as possible because such defects could act as nonradiative recombination centers which would tend to reduce efficiency and increase lasing thresholds. They, therefore, fabricated their DH lasers by LPE from the GaAsAlAs semiconductor system; i.e., early forms of the DH lasers comprised an n-GaAs substrate on which were grown the following layers:

n-$Al_xGa_{1-x}$As, p-GaAs (the active region) and p-$Al_xGa_{1-x}$As.

Because GaAs and AlAs are nearly lattice matched at the growth temperature (about 800°C), GaAs and AlGaAs were even better lattice matched, so that particularly good heterojunctions were formed during LPE fabrication.

When operated c.w. at room temperature, however, these early forms of the DH laser typically had relatively short lifetimes ranging from only a few minutes to tens of hours. Consequently, systematic studies of DH lasers were undertaken in order to identify degradation mechanisms and to develop solutions to the short lifetime problem.

SUMMARY OF THE INVENTION

Since the reduction of process-induced stress (e.g., stress due to bonding of contacts) has been shown by R. L. Hartman and A. R. Hartman to increase the lifetime of DH lasers (see *Applied Physics Letters*, Vol. 23, p. 147 (1973)), we believe that the reduction of growth-induced stress may further extend the lifetime. More particularly, we have recognized that although GaAs and AlAs are nearly lattice matched at the LPE growth temperature, their lattice mismatch is magnified at room temperature (where the lasers are intended to operate) because of the different thermal expansion coefficients of the two materials. Therefore, at room temperature there is considerable stress in the grown epitaxial layers.

We propose that the process be reversed; i.e., that a slight lattice mismatch be intentionally introduced at the growth temperature so that the difference in thermal expansion, before a deleterious factor, can be taken advantage of to produce a better lattice match at room temperature where DH lasers are most often operated. In accordance with one embodiment of our invention, therefore, the average stress at room temperature between contiguous layers of $Al_xGa_{1-x}$As and $Al_yGa_{1-y}$As ($0 \leq x,y \leq 1, y > x$) can be reduced by the addition of small, controlled amounts of phosphorus during the growth of the latter layer so that the quaternary $Al_yGa_{1-y}As_{1-z}P_z$ is grown instead of the ternary $Al_yGa_{1-y}$As. We have found that the amount of phosphorus added must be properly chosen: too little added may reduce stress by only a minimal amount whereas too much added may in fact increase stress and may generate dislocations. In particular, in order to reduce the average stress in the quaternary layer to less than about $2 \times 10^8$ dynes/cm$^2$ the amount of phosphorus added should satisfy the condition:

$$0.03 \leq \frac{z}{y-x} \leq 0.05 \qquad (1)$$

Evidence of the beneficial effect of adding phosphorus was found in experiments which demonstrated that DH lasers comprising AlGaAsP-GaAs-AlGaAsP layers grown on a GaAs substrate, in accordance with our invention, generally exhibited lasing thresholds about 25 percent lower than conventional AlGaAs DH lasers containing no phosphorus. Moreover, many DH lasers containing phosphorus as aforesaid have been successfully operated c.w. at room temperature for more than 5000 hours, and several for more than 10,000 hours. Although in the latter case we have not as yet been able to correlate completely the addition of phosphorus to longer lifetimes, it is believed that the reduction of stress of this form should enhance laser lifetime.

At times we will use for convenience the abbreviations AlGaAs and AlGaAsP to represent, respectively, the ternary compound, aluminum gallium arsenide and the quaternary compound, aluminum gallium arsenide phosphide.

BRIEF DESCRIPTION OF THE DRAWING

Our invention, together with its various features and advantages, can be more easily understood from the following more detailed description taken in conjunction with the accompanying drawing, in which.

DETAILED DESCRIPTION

Figure 1:
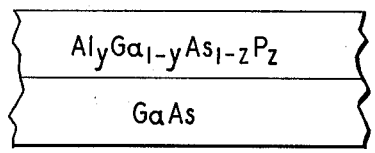
FIG. 1 shows contiguous layers of GaAs and $Al_yGa_{1-y}As_{1-z}P_z$ fabricated in accordance with one aspect of our invention.

We have established that liquid phase epitaxy (LPE) layers of $Al_yGa_{1-y}As$ grown on GaAs substrates are compressively stressed at room temperature to levels of $10^8$ to $10^9$ dynes/cm² depending on $y$, the fraction of aluminum in the grown layer. The stress, which is elastic in nature (i.e., no misfit or growth-induced dislocations are generated), can be accounted for by the differences in the thermal expansion coefficients between layer and substrate. These grown-in stresses are believed to be potentially deleterious to the performance and lifetimes of double heterostructure lasers. We have demonstrated, however, that LPE layers of $Al_yGa_{1-y}As_{1-z}P_z$ grown on GaAs substrates reduce or eliminate heterojunction stresses, provided the amount of phosphorus added is properly chosen. The essence of our invention is to use a quaternary compound to deliberately mismatch the epi-layer at the growth temperature so that on cooling the different thermal expansion coefficients of the substrate and layer will enable the lattice parameters to be substantially matched at room temperature. In contrast, at room temperature a ternary $Al_yGa_{1-y}As$ layer has a larger lattice parameter than the GaAs substrate, a situation which, as previously mentioned, induces considerable compressive stress in the grown layer.

The fraction z of phosphorus in the quaternary layer $Al_yGa_{1-y}As_{1-z}P_z$ was estimated from the change in stress in the grown layer, compared to that in $Al_yGa_{1-y}As$ with the same fraction $y$ of aluminum. This stress reduction was converted to an equivalent strain reduction since the strain $\epsilon = \Delta a/a = \sigma(2\nu/E)$, where $\nu$ and $E$ are Poisson's ratio and Young's modulus, respectively, $a$ is the lattice parameter of the binary substrate, and $\Delta a$ is the lattice parameter difference between the quaternary layer and binary substrate. Using (i) the values of $E$ and $\nu$ for GaAs published by Brantley in *Journal of Applied Physics*, Vol. 44, p. 534 (1973), (ii) a substrate lattice parameter of 5.6537 Angstrom, and (iii) the stress data determined as described below as a function of the phosphorus composition in the growth solution, we calculated a lattice parameter shift of about 0.0012 Angstroms per $10^{-5}$ atom fraction of phosphorus in the growth solution. Since the room temperature lattice parameter difference between GaP and $Ga_{0.66}Al_{0.34}As$ is about 0.21 Angstroms, we assumed Vegard's law was operative and estimated a phosphorus concentration ratio between the solid and liquid of about 300 for growth at 790°C.

The stress in the quaternary layer, the substrate-layer lattice parameter difference, and defect structure of the quaternary layer were analyzed using a modified Lang X-ray topography camera in three different modes of operation. First, the substrate lattice curvature due to the presence of the heteroepitaxial quaternary layer was determined by plotting the change in the position of the Bragg angle, $\Delta\theta_B$, as a function of sample position. The plots were obtained automatically and were called ABAC traces (Automatic Bragg Angle Control) and the substrate radius was converted to layer stress in a manner well known in the art and as described by G. A. Rozgonyi in *Review of Scientific Instruments*, Vol. 44, p. 1053, (August 1973). A {220} transmission X-ray topograph was then obtained. Since the LPE layer did not cover the entire substrate, defects unique to the layer were readily identified. Once the transmission X-ray topograph plate was exposed, the crystal was rotated and a (400) reflection rocking curve was obtained by operating the ABAC apparatus so that it plotted the intensity, I, as a function of Bragg angle. The I vs. $\theta_B$ traces contained characteristic $K_{\alpha 1}$-$K_{\alpha 2}$ peaks from both the layer and substrate. The measured peak shift ($K_\alpha$ PS) was used to estimate the room temperature lattice parameter differences between layer and substrate.

As shown in FIG. 1, $Al_yGa_{1-y}As_{1-z}P_z$ quaternary layers were grown at 790°C on (100) oriented GaAs substrates in an apparatus of the type described by M. B. Panish in *Journal of Applied Physics*, Vol. 44, p. 2659 (June 1973) at a cooling rate of 0.1°C/minute for times ranging from 5 to 60 minutes. Illustratively, the growth liquid contained 0.0020 atom fraction Al, 0.985 atom fraction Ga and 0.013 atom fraction of As, with the phosphorus concentration varied in the $10^{-6}$ to $10^{-5}$ atom fraction range. The starting liquid concentration required to yield the quaternary compositions of interest were estimated from a thermodynamic treatment of the quaternary in which the liquid was taken to be a simple solution and the solid a strictly regular solution.

For the above composition, the value of $y$ (aluminum fraction) was determined from the peak energy of the photoluminescence to be approximately 0.34 by comparison with the data given in FIG. 1 of an article by M. B. Panish in *Journal of Applied Physics*, Vol. 44, p. 2667 (June 1973).

Figure 3:
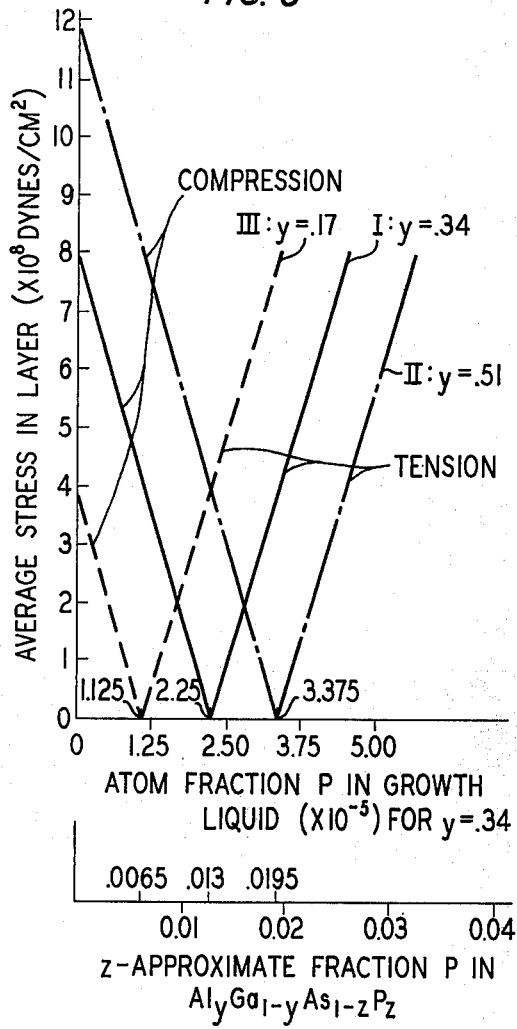
FIG. 3 is a graph showing how the average stress between layers of GaAs and AlGaAsP is related to the amount of phosphorus and aluminum in the latter layer.

As a result of the foregoing experiments, we measured the stress in quaternary layers of $Al_{0.34}Ga_{0.66}As_{1-z}P_z$ for various values of z ranging from 0 to 0.04 approximately, and plotted the data as graph I of FIG. 3. Graph I shows that the room temperature stress is, within experimental error, linearly dependent on the amount of phosphorus incorporated in the quaternary layer. An important aspect of graph I is the fact that as z increases the stress first decreases from a maximum compressive stress of about $8 \times 10^8$ dynes/cm² at $z = 0$ (i.e., an $Al_{0.34}Ga_{0.66}As$ layer on a GaAs substrate) to substantially zero stress at $z = 0.013$. The addition of more phosphorus from this point on causes the stress to increase and to switch from compressive to tensile. In fact, the addition of too much phosphorus (i.e., $z \geq 0.03$) produces a tensile stress which exceeds that of a ternary $Al_{0.34}Ga_{0.66}As$ layer ($z = 0$).

In a similar fashion, if the quaternary layer contains less aluminum than $y = 0.34$, then graph I shifts to the left in FIG. 3, e.g., graph III for $y = 0.17$. On the other hand, if the quaternary layer contains more aluminum than $y = 0.34$, then graph I shifts to the right in FIG. 3, e.g., graph II for $y = 0.51$. In the latter two cases, therefore, the point of substantially zero average stress also shifts, being approximately $z = 0.006$ for $y = 0.17$ and being approximately $z = 0.019$ for $y = 0.51$. In general, substantially zero average stress occurs in the quaternary layer on a GaAs substrate when the amount of phosphorus $z$ is related to the amount of aluminum $y$ as follows:

$$z/y \gtrsim 0.04. \qquad (2)$$

However, as a practical matter for many device applications (e.g., DH lasers) it will be sufficient if the average stress is reduced below $2 \times 10^8$ dynes/cm$^2$, which occurs whenever the following inequality is satisfied approximately:

$$0.03 < z/y < 0.05. \qquad (3)$$

Even more generally, however, if the substrate is not purely GaAs but contains some aluminum (i.e., an $Al_xGa_{1-x}As$ substrate or underlying layer), then substantially zero average stress occurs at $$\frac{z}{(y-x)} \gtrsim 0.04, \qquad (4)$$

and to reduce the average stress to less than about $2 \times 10^8$ dynes/cm$^2$, the following inequality should be satisfied approximately:

$$0.03 \leq \frac{z}{(y-x)} \leq 0.05, \qquad (5)$$

where the quantity $(y-x)$ is the absolute value of the difference between $y$ and $x$. Note that inequalities (1) and (5) are identical.

Figure 4:
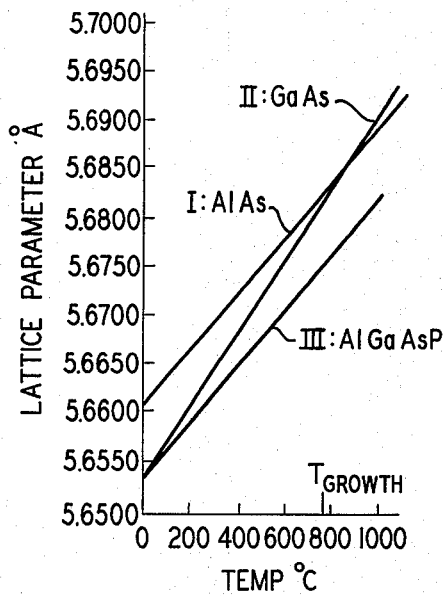
FIG. 4 is a graph showing the variation with temperature of the lattice parameters of AlAs (curve I), GaAs (curve II) and AlGaAsP (curve III, which is estimated for a quaternary composition lattice matched to GaAs at room temperature).

The origin of equation (4) can be understood from the following brief discussion. It is known in the prior art, and confirmed by our experiments on GaAlAs-GaAs layers grown by LPE, that the room temperature lattice mismatch between AlAs and GaAs is about 0.008 Angstroms (see FIG. 4). We have also determined that in quaternary $Al_yGa_{1-y}As_{1-z}P_z$ layers grown on GaAs substrates that the lattice parameter change is approximately 0.002 Angstroms for each percent of phosphorus added to the Group V component of the compound. Therefore, generalizing for the amount of phosphorus required to reduce to substantially zero the average stress in a quaternary layer of $Al_yGa_{1-y}As_{1-z}P_z$ grown on a ternary layer of $Al_xGa_{1-x}As$, we can write $$z = \frac{0.008 (y-x)}{0.20} = 0.04 (y-x), \qquad (6)$$

which corresponds to equation (4).

It should be emphasized that in the foregoing procedure, because the substrate-layer lattice parameters are intentionally mismatched at the growth temperature, the probability for formation of interfacial misfit dislocations is increased. Those samples which exhibit stress relief by misfit dislocation generation will necessarily bend the substrate to a lesser degree and give a lower value of layer stress. It was, therefore, important that the total layer misfit strain energy at the growth temperature (which is proportional to both the layer thickness and the lattice mismatch at that temperature) be kept below a threshold value which is defined by FIG. 6 of the concurrently filed application of Petroff and Rozgonyi, Case 2–7, supra. In particular, compressively stressed layers in the vicinity of the minimum room temperature stress region in FIG. 3 (i.e., $z$ satisfying inequality (5)) were grown without misfit dislocations provided that the thickness of the quaternary was maintained less than a value in the range of approximately 1 $\mu$m to 2 $\mu$m when $z$ was in the range of about 0.03 to 0.01. Of course, fabrication and/or device considerations limit how thin the layer can be. Within this thickness range the actual thickness used depended on the value of $z$, i.e., larger values of $z$ required thinner layers. As is well known in the art, however, growth without the creation of interfacial misfit dislocations does not eliminate substrate defects which extend into the quaternary layer. The manner in which a unidirectional sheet of infinitely long misfit dislocations is intentionally created at the substrate-layer interface in order to prevent substrate defects from extending into the quaternary layer is described by Petroff and Rozgonyi in the concurrently filed application; Case 2–7, supra.

Figure 2:
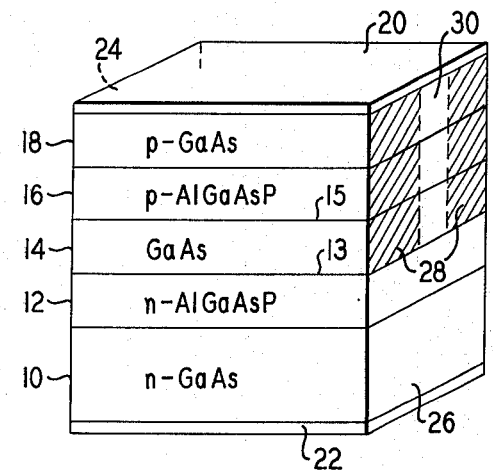
FIG. 2 is a schematic drawing of a DH laser in accordance with one embodiment of our invention.

Application of the foregoing stress reduction procedures to the LPE growth of double heterostructure lasers has resulted in significant and reproducible reductions in the threshold current density for lasing. As shown in FIG. 2, a DH laser in accordance with an illustrative embodiment of our invention comprises an n-GaAs substrate 10 on which were grown by LPE the following layers in the order recited: an n-$Al_yGa_{1-y}As_{1-z}P_z$ layer 12; an n-type, p-type or compensated GaAs layer 14; a p-$Al_qGa_{1-q}As_{1-p}P_p$ layer 16 and a p-GaAs layer 18. In general, of course, layer 14 may also include Al or Al and P and the conductivity types of the layers may be reversed if a p-type substrate is used. As is well known in the art, however, the fraction of Al added to layer 14 should be less than about 0.4, the point at which AlGaAs switches from a direct gap to an indirect gap semiconductor.

Layers 12, 14, and 16 comprise a double heterostructure and the interfaces 13 and 15 therebetween form a pair of heterojunctions which serve to confine both light and injected carriers to the active region (layer 14) when the device is forward biased. Typically the heterostructure forms a symmetric waveguide in which case $y = q$ and $z = p$. Layer 18 is utilized to make good electrical contact to the device and usually includes a thin (0.2 $\mu$m) high conductivity surface layer (not shown) formed by diffusing Zn therein. Electrical contacts 20 and 22 are deposited, or otherwise formed, on layer 18 and substrate 10, respectively. A resonator is formed by mirrors 24 and 26 which are typically cleavage faces of the GaAs crystal. One or more heat sinks (not shown) may be thermally coupled to substrate 10 or layer 18 by means well known in the art.

In one embodiment a stripe contact geometry is defined by bombarding the spatially separate zones 28 with high energy protons along the length of device and approximately to the depth of heterojunction 13. As described in copending U.S. application Ser. no. '204,222 (D'Asaro 10-4-6-3) filed on Dec. 2, 1971 now U.S. Pat. No. 3,824,133 isued on July 16, 1974, such proton bombardment produces high resistivity in zones 28 which serves to confine the electrical current applied through contact 20 to the unbombarded zone 30 (about 13 $\mu$m wide). In addition, this configuration tends to confine the laser radiation to oscillation in the fundamental transverse mode parallel to the plane of the heterojunctions. We have also constructed, however, broad-area-contact lasers in which no proton bombardment was performed and, therefore, the laser was pumped across its entire width and length.

For the case of a symmetric structure, numerous lasers of the type shown in FIG. 2 were fabricated by utilzing phosphorus compositions ranging from about 30 to 150 $\mu$gm GaP per 4 gm Ga in the growth solutions of layers 12 and 16. The layers were grown by LPE at about 780° C with a cooling rate of 0.1° C/min. The corresponding fraction $z$ of phosphorus, therefore, ranged from about 0.004 to 0.02 whereas the fraction ($y = q$) of aluminum was about 0.24. For different devices the thickness $d$ of the active region (layer 14) ranged from about 0.15 $\mu$to 0.40$\mu$m. In an illustrative example of the DH laser of FIG. 2, the substrate 10 comprised n-GaAs doped with Si to $3 \times 10^{18}/cm^3$, layer 12 was 1.95 $\mu$m thick and comprised n-$Al_{0.24}Ga_{0.76}As_{1-z}P_z$ doped with Te to $2.5 \times 10^{17}/cm^3$ layer 14 comprised p-GaAs doped with Ge to $4 \times 10^{17}/cm^3$, layer 16 was 0.79 $\mu$m thick and comprised p-$Al_{0.24}Ga_{0.76}As_{1-p}P_p$ ($p = z$) doped with Ge to $3.3 \times 10^{17}/cm^3$, and layer 18 comprised p-GaAs doped with Ge to $2 \times 10^{18}/cm^3$. In addition, the resonator length was about 380 $\mu$m. Substituting $y=0.24$ and $x=0$, inequality (1) reduces to $0.007 < z < 0.012$ approximately for stress reduction in these layers.

The lowest thresholds for such lasers were compared with the lowest thresholds of similar ternary DH lasers (no phosphorus in layers 12 and 16). On the average, the quaternary lasers (FIG. 2) exhibited thresholds which were about 25 percent lower than the thresholds of ternary lasers. For example, at $d = 0.15$ $\mu$m the lowest threshold of stripe geometry quaternary lasers was about 1.4 kA/cm$^2$ whereas that of ternary lasers as 1.8 kA/cm$^2$. At $d = 0.4$ $\mu$m the quaternary threshold was 3.0 kA/cm$^2$ whereas the ternary was 3.7 kA/cm$^2$. Similarly, for broad-area-contact lasers with $d = 0.15$ $\mu$m, the lowest threshold of the quarternary lasers was about 0.92 kA/cm$^2$ whereas that of the ternary was 1.22 kA/cm$^2$. At $d = 0.3$ $\mu$m the corresponding comparison was 1.15 kA/cm$^2$. Thus, it is apparent that the addition of appropriate amounts of phosphorus to layers 12 and 16 produced significant reductions in lasing thresholds.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, the structures and techniques described herein find application in numerous other devices such as single heterostrucure lasers and heterostructre LEDs of the type desccribed by I. Hayashi in application Ser. No. 307,219 (Case 8), now U.S. Pat. No. 3,801,928 issued on Apr. 2, 1974, and application Ser. No. 307,377 (Case 7) now U.S. Pat. No. 3,812,516 issued on May 21, 1974, concurrently filed with one another on Nov. 17, 1972. Moreover, use is also contemplated in non-optical devices where it is desired to reduce stress or misfit dislocations.

What is claimed is:

1. A multilayer structure comprising
a first layer of $Al_xGa_{1-x}As$,
a second layer of $Al_yGa_{1-y}As_{1-z}P_z$ contiguous with said first layer,
the fraction $y$ of Al is said second layer exceeding the fraction $x$ of Al in said first layer, and
the fractions of Al, Ga and P in said first and second layers being mutually adapted to reduce the average stress in said second layer as compared with the stress which would be produced in the absence of phosphorus therein at substantially room temperature.

2. The structure of claim 1 wherein
the fractions of Al, Ga and P in said first and second layers satisfy the condition that $$0.03 \leq \frac{z}{y-x} \leq 0.05,$$

thereby to reduce the average stress in said second layer to less than about $2 \times 10^8$ dynes/cm$^2$ at substantially room temperature.

3. The structure of claim 2 wherein the fractions of Al, Ga and P in said first and second layers satisfy approximately the condition $$\frac{z}{y-x} = 0.04,$$

thereby to reduce to substantially zero the average stress in said seond layer.

4. The structure of claim 2 wherein $x = 0$, said first layer comprises GaAs, and the fractions of P and Al in said second layer satisfy the condition that $0.03 < z/y < 0.05$.

5. The structure of claim 4 wherein $$\frac{z}{y} = 0.04$$

approximately, thereby to reduce to substantially zero the average stress in said second layer.

6. A double heterostructure light emitting device including:
a substrate comprising said first GaAs layer of claim 4,
a first wide bandgap layer comprising said $Al_yGa_{1-y}As_{1-z}P_z$ layer of claim 4,
an active layer comprising $Al_pGa_{1-p}As$, $p < y$, formed on said first wide bandgap layer and,
a second wide bandgap layer comprising $Al_qGa_{1-q}As_{1-m}P_m$, $q > p$, formed on said active layer.

7. The device of claim 6 wherein $p$ is substantially zero and said active layer comprises GaAs.

8. The device explanation claim 6 wherein said substrate is n-type, said $Al_yGa_{1-y}As_{1-z}P_z$ layer is n-type, and said $Al_qGa_{1-q}As_{1-m}P_m$ layer is p-type.

9. The device of claim 8 wherein said active layer is p-type.

10. The device of claim 8 including further a low resistivity contacting layer of p-GaAs formed on said $Al_qGa_{1-q}As_{1-m}P_m$ layer.

* * * * *

UNITED STATES PATENT AND TRADEMARK OFFICE
CERTIFICATE OF CORRECTION

PATENT NO. : 3,958,263
DATED : May 18, 1976
INVENTOR(S) : Morton B. Panish and George A. Rozgonyi It is certified that error appears in the above-identified patent and that said Letters Patent are hereby corrected as shown below:

Column 4, line 35, change "quanternary" to --quaternary--.

Column 7, line 40, after "1.15 kA/cm$^2$" add --to 1.48 kA/cm$^2$--

Column 8, claim 3, line 31, change "seond" to --second--.

Signed and Sealed this

Ninth Day of November 1976

[SEAL]

Attest:

RUTH C. MASON
*Attesting Officer*

C. MARSHALL DANN
*Commissioner of Patents and Trademarks*